(12) United States Patent
Ishihara

(10) Patent No.: US 7,420,241 B2
(45) Date of Patent: Sep. 2, 2008

(54) SEMICONDUCTOR MEMORY DEVICE AND METHOD OF MANUFACTURING THE SAME

(75) Inventor: Takamitsu Ishihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 11/283,622

(22) Filed: Nov. 21, 2005

(65) Prior Publication Data

US 2006/0267067 A1    Nov. 30, 2006

(30) Foreign Application Priority Data

May 31, 2005   (JP)   .............................. 2005-158731

(51) Int. Cl.
*H01L 29/788* (2006.01)

(52) U.S. Cl. ........................ 257/315; 257/316; 257/346; 257/386; 257/389; 257/E29.268; 257/E29.269; 257/E29.279

(58) Field of Classification Search ................ 257/315, 257/316, 346, 387, 389, E29.122, E29.268, 257/E29.269, E29.279
See application file for complete search history.

(56) References Cited

U.S. PATENT DOCUMENTS

| 6,835,987 | B2 * | 12/2004 | Yaegashi | 257/391 |
| 7,154,141 | B2 * | 12/2006 | Wang et al. | 257/316 |
| 2003/0227049 | A1 * | 12/2003 | Sakakibara | 257/315 |
| 2006/0118855 | A1 * | 6/2006 | Lee et al. | 257/315 |

OTHER PUBLICATIONS

Saito, et al., Mobility Reduction Due to Remote Charge Scattering in Al2O3/SiO2 Gate-Stacked MISFETs, Extended Abstracts of the 2002 International Conference on Solid State Devices and Materials, Nagoya, 2002, pp. 704-705.

Kaneko, et al., Flatband Voltage Shift Caused by Dopants Diffused from Poly-Si Gate Electrode in Poly-Si/HlSiO/SiO2/Si, Extended Abstracts of the 2003 International Conference on Solid State Devices and Materials, Tokyo, 2003, pp. 56-57.

* cited by examiner

*Primary Examiner*—Matthew E Warren
(74) *Attorney, Agent, or Firm*—Amin, Turocy & Calvin, LLP

(57) ABSTRACT

A semiconductor memory device includes a memory cell which includes a first gate insulation film provided on the semiconductor substrate; a floating gate electrode provided on the first gate insulation film; a second gate insulation film provided on the floating gate electrode; a control gate electrode provided on the second gate insulation film; a source layer and a drain layer that are provided in the semiconductor substrate, the source layer and the drain layer respectively being provided either side of a channel region which is below the floating gate electrode; a source electrode that is electrically connected to the source layer; a buffer film provided on the drain layer; and a memory cell including a drain electrode electrically connected to the drain layer through the buffer film, wherein when viewing the surface of the semiconductor substrate from above, an overlapped area between the floating gate electrode and the drain layer is smaller than an overlapped area between the floating gate electrode and the source layer.

7 Claims, 13 Drawing Sheets

SEMICONDUCTOR MEMORY DEVICE AND METHOD OF MANUFACTURING THE SAME

CROSS-REFERENCE TO RELATED APPLICATION

This application is based upon and claims the benefit of priority from the prior Japanese Patent Applications No. 2005-158731, filed on May 31, 2005, the entire contents of which are incorporated herein by reference.

BACKGROUND OF THE INVENTION

1. Field of the Invention

The present invention relates to a semiconductor memory device and a method of manufacturing the same.

2. Background Art

A demand for an NOR flash memory as a semiconductor memory device for digital cameras, portable telephones, and portable audio devices is increasing rapidly. These devices are increasingly required to have a smaller size, a lighter weight, and an advanced function. Along these trends, miniaturization, high integration, a low power supply voltage, and improved reliability are required for the NOR flash memory.

However, when the power supply voltage is reduced, operating speed of the NOR flash memory decreases. When the power supply voltage is increased, the operating speed improves, but the requirement for the low power supply voltage cannot be satisfied.

When memory cells are miniaturized, electric charges cannot be stored sufficiently in a floating gate electrode, and a threshold voltage of the memory cells decreases. This reduces reliability.

SUMMARY OF THE INVENTION

An advantage of an aspect of the present invention is to provide a highly reliable semiconductor memory device that can have a low power supply voltage without decreasing the operating speed, and a method of manufacturing the semiconductor memory device.

A semiconductor memory device according to an embodiment of the present invention comprises a memory cell which includes a semiconductor substrate; a first gate insulation film provided on the semiconductor substrate; a floating gate electrode provided on the first gate insulation film; a second gate insulation film provided on the floating gate electrode; a control gate electrode provided on the second gate insulation film; a source layer and a drain layer respectively provided either side of a channel region which is below the floating gate electrode; a source electrode that is electrically connected to the source layer; a buffer film provided on the drain layer; and a drain electrode electrically connected to the drain layer through the buffer film, wherein when viewing the surface of the semiconductor substrate from above, an overlapped area between the floating gate electrode and the drain layer is smaller than an overlapped area between the floating gate electrode and the source layer.

A semiconductor memory device according to an embodiment of the present invention comprises a memory cell which includes a first gate insulation film provided on a semiconductor substrate; a floating gate electrode provided on the first gate insulation film; a second gate insulation film provided on the floating gate electrode; a control gate electrode provided on the second gate insulation film; a source layer and a drain layer respectively provided either side of a channel region which is below the floating gate electrode; a source electrode that is electrically connected to the source layer; and a drain electrode that is electrically connected to the drain layer, wherein a plurality of the memory cells are arranged adjacently each other in channel length direction, wherein an interval between memory cells adjacent at the drain electrode side is smaller than an interval between memory cells adjacent at the source electrode side.

A method of manufacturing a semiconductor memory device according to an embodiment of the present invention comprises a memory cell which stores electric charges into a floating gate electrode or discharges electric charges from the floating gate electrode through a channel region between a source region and a drain region under control of a control gate electrode, a plurality of the memory cells being arranged adjacently each other in a channel length direction by sandwiching the source region or the drain region, the method comprises laminating a first gate insulation film, a floating gate material, a second gate insulation film, and a control gate material on a semiconductor substrate sequentially in this order; etching the first gate insulation film, the floating gate material, the second gate insulation film, and the control gate material on each region of the source and the drain, thereby forming the floating gate electrode and the control gate electrode; depositing a buffer film made of an insulation material on the semiconductor substrate; etching the buffer film on the source region while leaving the buffer film on the drain region; and introducing impurities into the source region and the drain region.

A method of manufacturing a semiconductor memory device according to an embodiment of the present invention, the device has a memory cell which stores electric charges into a floating gate electrode or discharges electric charges from the floating gate electrode through a channel region between a source region and a drain region under control of a control gate electrode, a plurality of the memory cells being arranged adjacently each other in a channel length direction by sandwiching the source region or the drain region, the method comprises laminating a first gate insulation film, a floating gate material, a second gate insulation film, and a control gate material on a semiconductor substrate sequentially in this order; etching the first gate insulation film, the floating gate material, the second gate insulation film, and the control gate material on each region of the source and the drain, thereby forming laminated bodies each consisting of the first gate insulation film, the floating gate electrode, the second gate insulation film, and the control gate electrode, such that an interval between the laminated bodies adjacently disposed to sandwich the drain region is smaller than an interval between the laminated bodies adjacently disposed to sandwich the source region; depositing a buffer film made of an insulation material between the adjacent laminated bodies; depositing a masking insulation film having an etching rate different from that of the buffer film, thereby filling the masking insulation film into the interval between the laminated bodies on the drain region, without filling the masking insulation film into the interval between the laminated bodies on the source region; anisotropically etching the masking insulation film, thereby exposing the buffer film on the source region while keeping the buffer film on the drain region covered with the masking insulation film; etching the buffer film on the source region in self alignment while leaving the buffer film on the drain region by using the masking insulation film as a mask; and introducing impurities into the source region and the drain region.

DETAILED DESCRIPTION OF THE INVENTION

Embodiments of the present invention will be explained below with reference to the accompanying drawings. The present invention is not limited by the embodiments.

First Embodiment

Figure 1:
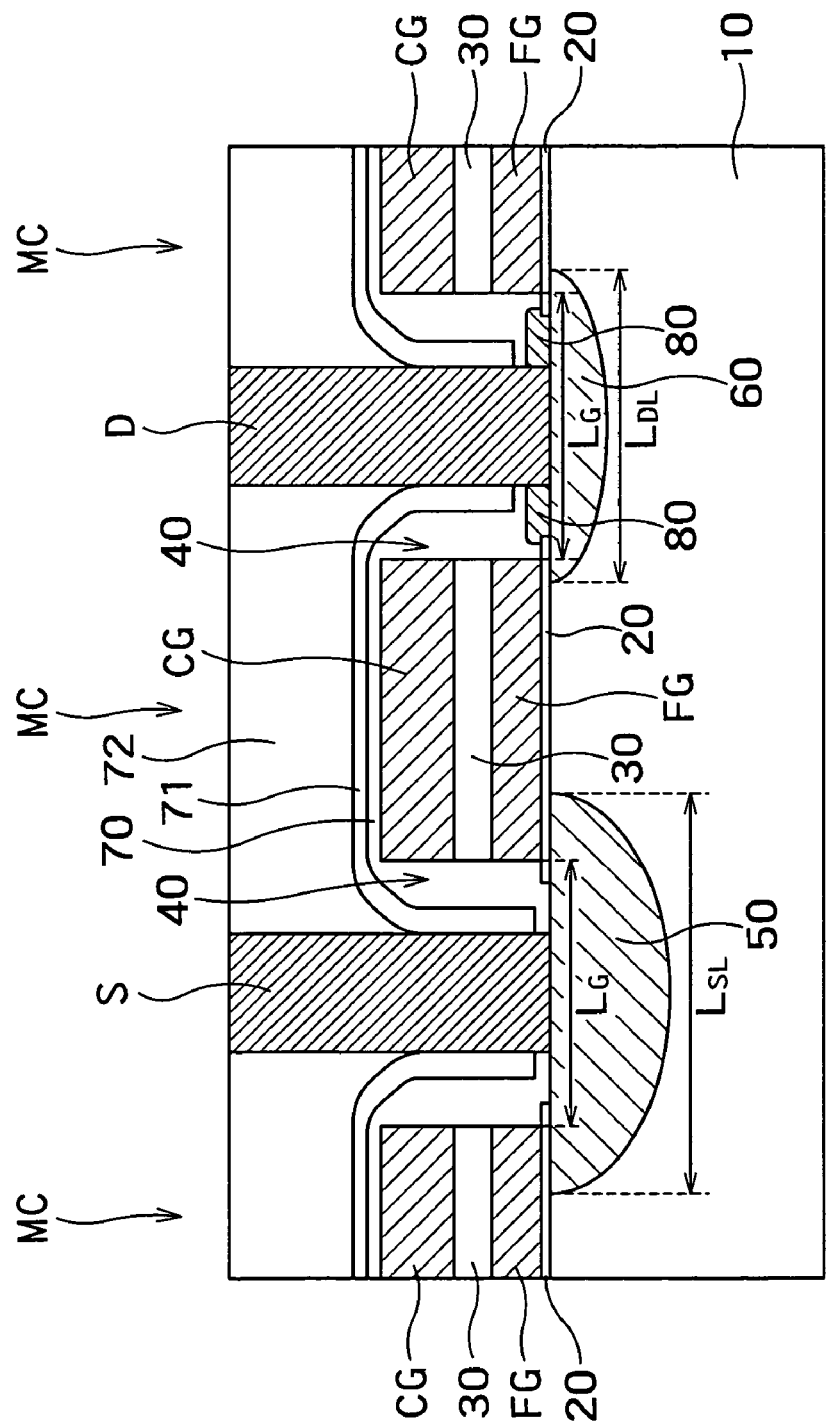
FIG. 1 is a cross-sectional diagram of a semiconductor memory device 100 according to a first embodiment of the present invention.

FIG. 1 is a cross-sectional diagram of a semiconductor memory device 100 according to a first embodiment of the present invention. The semiconductor memory device 100 is an NOR nonvolatile semiconductor memory device such as an NOR flash memory.

The semiconductor memory device 100 has plural memory cells MCs. These memory cells MCs are adjacently disposed on a semiconductor substrate 10 so as to sandwich a source electrode S or a drain electrode D. While three memory cells MCs are shown in FIG. 1, in an actual memory device, many memory cells MCs are provided on the semiconductor substrate 10. The cross-sectional diagram in FIG. 1 shows the semiconductor memory device cut along a channel length direction of the memory cells MCs.

Each memory cell MC has a first gate insulation film 20 provided on the semiconductor substrate 10, a floating gate electrode FG provided on the first gate insulation film 20, a second gate insulation film 30 provided on the floating gate electrode FG, and a control gate electrode CG provided on the second gate insulation film 30. The first gate insulation film 20, the floating gate electrode FG, the second gate insulation film 30, and the control gate electrode CG are in a laminated layer structure. The floating gate electrode FG and the control gate electrode CG extend in a perpendicular direction relative to the cross-sectional diagram shown in FIG. 1.

The semiconductor substrate 10 consists of silicon, for example, and can be an SOI (Silicon-On-Insulator) layer of an SOI substrate. The floating gate electrode FG and the control gate electrode CG consist of polysilicon, for example. Each of the first gate insulation film 20 and the second gate insulation film 30 consists of a silicon oxide film, a silicon oxynitride film, and a high dielectric insulation film (for example, HfO2) having a higher dielectric constant than that of a silicon oxide film. The first gate insulation film 20 functions as a tunnel gate insulation film that stores electric charges into the floating gate electrode FG or discharges electric charges from the floating gate electrode FG.

A sidewall insulation film 40 is provided on a sidewall of the floating gate electrode FG and the control gate electrode CG, respectively. Further, interlayer insulation films 70 to 72 are provided to cover the laminated layer structure including the first gate insulation film 20, the floating gate electrode FG, the second gate insulation film 30, and the control gate electrode CG. The sidewall insulation film 40 and the interlayer insulation films 70 to 72 are made of silicon oxide film, for example. The interlayer insulation films 70 to 72 can be silicon nitride films or TEOS films.

The memory cell MC further includes a source layer 50, a drain layer 60, a source electrode S, a drain electrode D, and a buffer film 80. The source layer 50 and the drain layer 60 are formed on the semiconductor substrate 10 to sandwich a channel region below the floating gate electrode FG. The source electrode S is electrically connected to the source layer 50. The drain electrode D is electrically connected to the drain layer 60.

When the semiconductor substrate 10 is a P-type semiconductor substrate, the source layer 50 and the drain layer 60 are N-type impurity diffusion layers. When the semiconductor substrate 10 is an N-type semiconductor substrate, the source layer 50 and the drain layer 60 are P-type impurity diffusion layers. The source electrode S and the drain electrode D are made of metal including, for example, copper or aluminum.

In the cross-sectional surface of the memory cell MC in the channel length direction, a width LDL of the drain layer 60 is smaller than a width LSL of the source layer 50. A distance LG between the floating gate electrodes FG of the adjacent memory cells MCs in the source region is equal to a distance LG between the floating gate electrodes FG of the adjacent memory cells MCs in the drain region. Therefore, viewed from above the surface of the semiconductor substrate 10, an overlapped region between the floating gate electrode FG and the drain layer 60 is smaller than an overlapped region between the floating gate electrode FG and the source layer 50. This is clear from the fact that a difference between the width LDL of the drain layer 60 and the distance LG, that is, (LDL−LG), is smaller than a difference between the width LSL of the source layer 50 and the distance LG, that is, (LSL−LG).

The buffer film 80 is provided on the drain layer 60, but is not provided on the source layer 50. The drain electrode D is connected to the drain layer 60 by piercing through the buffer film 80. The buffer film 80 is an insulator, and can be a silicon oxide film. However, it is preferable that the buffer film 80 is a high dielectric insulation film having a higher dielectric constant than that of the silicon oxide film. This is because the high dielectric insulation film can decrease the drain voltage, thereby decreasing the total power consumption of the semiconductor memory device 100. The buffer film 80 made of the high dielectric insulation film is explained in detail in a third embodiment.

The memory cell MC stores electric charges into the floating gate electrode FG or discharges electric charges from the floating gate electrode FG through the channel region between the source layer 50 and the drain layer 60 under the control of the control gate electrode CG. Based on this, the memory cell MC can store data.

According to the present embodiment, the width LDL of the drain layer 60 is smaller than the width LSL of the source layer 50. Consequently, a running distance of electric charges (for example, electrons) becomes long near the end of the drain layer 60 in the channel region of the memory cell MC. When the running distance of the electric charges becomes long, the electric charges are accelerated to a large extent by an electric field that is concentrated to the end of the drain layer 60. Accordingly, average energy of the electric charges increases, thereby increasing electric charges (hot electrons) having larger energy than energy of the barrier height at the interface between the semiconductor substrate 10 and the first gate insulation film 20. Since the increasing amount of electric charges flow to the floating gate electrode FG, the semiconductor memory device 100 according to the present embodiment can efficiently write data into the memory cells.

FIG. 2 to FIG. 9 are cross-sectional diagrams of the semiconductor memory device 100 showing a flow of a method of manufacturing the semiconductor memory device 100 according to the first embodiment. The method of manufacturing the semiconductor memory device 100 is explained below with reference to FIG. 2 to FIG. 9.

Figure 2:
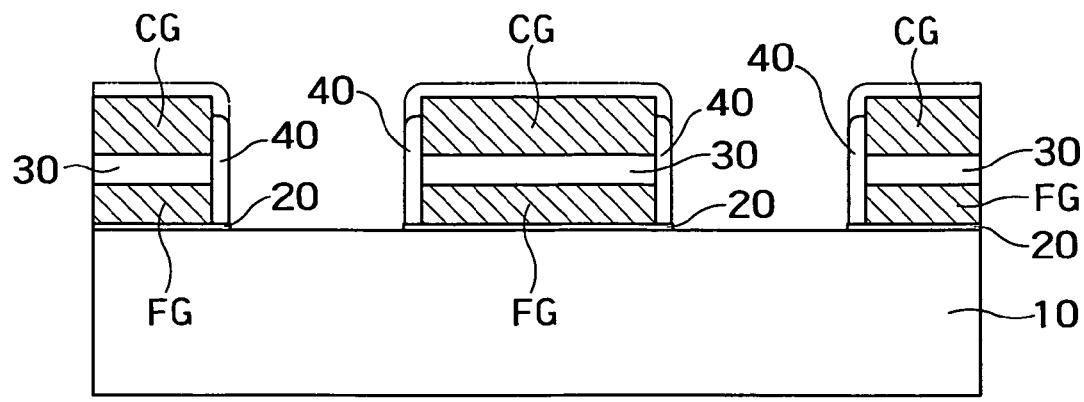
FIG. 2 to FIG. 9 are cross-sectional diagrams of the semiconductor memory device 100 showing a flow of a method of manufacturing the semiconductor memory device 100 according to the first embodiment.
Figure 3:
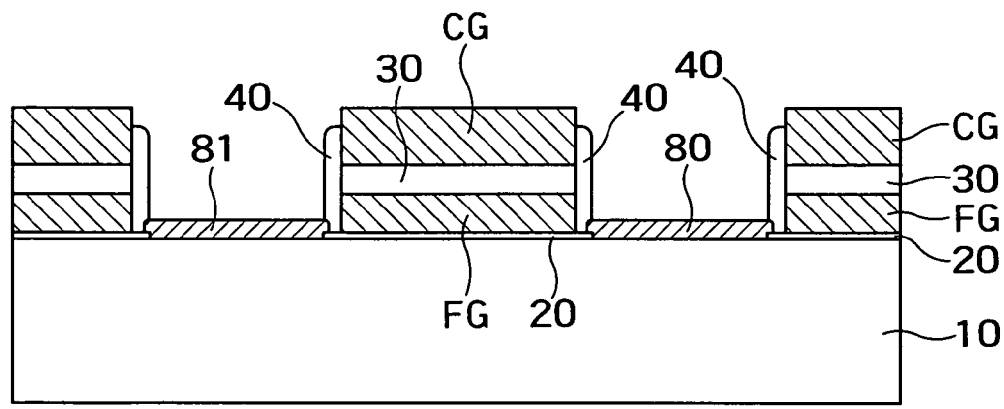

First, a silicon oxide film, a silicon oxynitride film, and a high dielectric insulation film (for example, HfO2) having a higher dielectric constant than that of a silicon oxide film are formed as the first gate insulation film 20 on the semiconductor substrate 10. Next, doped polysilicon is deposited as a material of the floating gate electrode FG on the first gate insulation film 20. A silicon oxide film is deposited as the second gate insulation film 30 on the floating gate electrode FG. Doped polysilicon is deposited as a material of the control gate electrode CG on the second gate insulation film 30. The first gate insulation film 20, the material of the floating gate electrode FG, the material of the second gate insulation film 30, and the material of the control gate electrode CG on the source region and on the drain region are etched by reactive ion etching (RIE). As a result, the floating gate electrode FG and the control gate electrode CG are formed as shown in FIG. 2. A lamination of the first gate insulation film 20, the floating gate electrode FG, the second gate insulation film 30, and the control gate electrode CG that are laminated together is hereinafter called a "laminated body".

A material of the sidewall insulation film 40 is deposited to cover the laminated body. The material of the sidewall insulation film 40 is a silicon oxide film or a silicon nitride film as an insulation film. This insulation film is anisotropically etched by RIE, thereby forming the sidewall insulation film 40 that covers the sidewalls of the first gate insulation film 20, the floating gate electrode FG, the second gate insulation film 30, and the control gate electrode CG, respectively. At this time, the insulation film between the adjacent laminated bodies is removed, and the surface of the semiconductor substrate 10 at this part is exposed. The insulation film on the control gate electrode CG is also removed. However, in order to protect the control gate electrode CG, the insulation film 40 on the control gate electrode CG can be left on the control gate electrode CG as shown by a broken line in FIG. 2.

Next, the insulation film is deposited, and thereafter this insulation film is etched to form the buffer films 80 and 81. The buffer film 80 is provided in the region where the drain layer is formed at a later process. The buffer film 81 is provided in the region where the source layer is formed at a later process. Since the buffer film 81 is removed at a later process, this film is not actually used as a buffer film. A material of the buffer films 80 and 81 is an insulation material having an etching selectivity different from that of the material of the sidewall insulation film 40. For example, when the material of the sidewall insulation film 40 is a silicon oxide film, the material of the buffer films 80 and 81 can be a silicon nitride film. When the material of the sidewall insulation film 40 is a silicon nitride film, the material of the buffer films 80 and 81 can be a silicon oxide film. The material of the buffer films 80 and 81 is not particularly specified when the material can be selectively etched relative to the material of the sidewall insulation film 40. However, as described above, in order to decrease the drain voltage, it is preferable that the material of the buffer films 80 and 81 is a high dielectric insulation film having a higher dielectric constant than that of the silicon oxide film.

Figure 4:
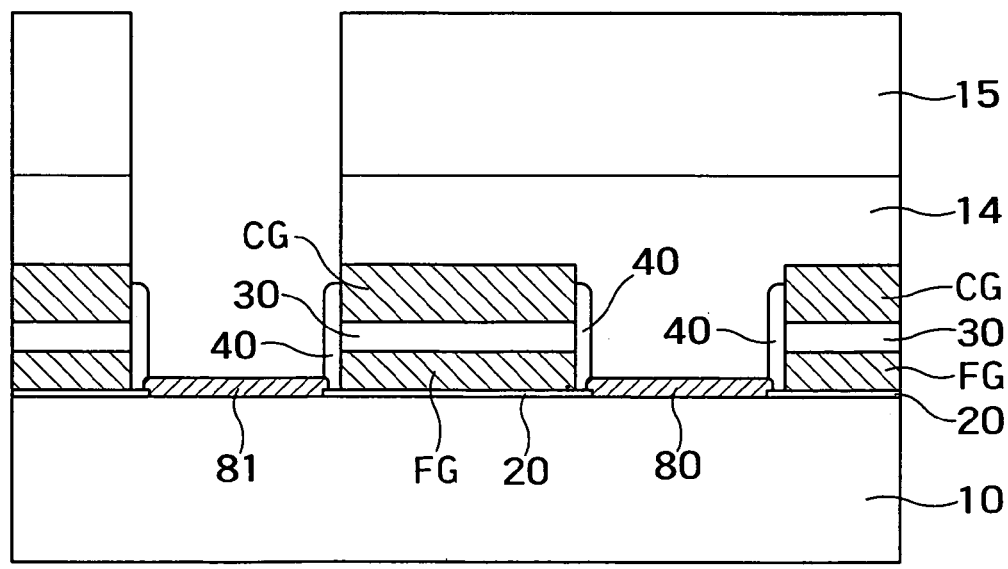

Next, an insulation film 14 is deposited as shown in FIG. 4. A material of the insulation film 14 has an etching selectivity different from those of the materials of the sidewall insulation film 40 and the buffer films 80 and 81. For example, the material of the insulation film 14 is a TEOS film or a silicon nitride film. A photoresist 15 is patterned using lithography, and thereafter, the insulation film 14 is etched by RIE. As a result, the buffer film 81 provided in the formation region of the source layer is exposed, while the buffer film 80 provided in the formation region of the drain layer is kept covered with the insulation film 14.

Figure 5:
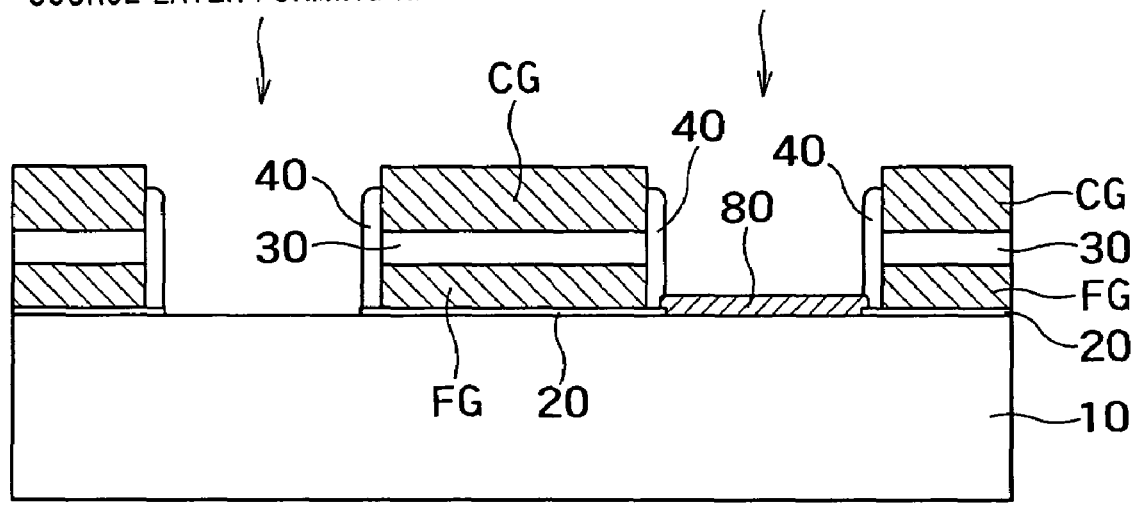

Next, using the insulation film 14 as a hard mask, the buffer film 81 is etched while keeping the buffer film 80 left as it is. Since the etching selectivity of the material of the buffer film 81 is different from that of the material of the sidewall insulation film 40, only the buffer film 81 can be selectively etched. Thereafter, the insulation film 14 is removed to obtain a structure as shown in FIG. 5.

Figure 6:
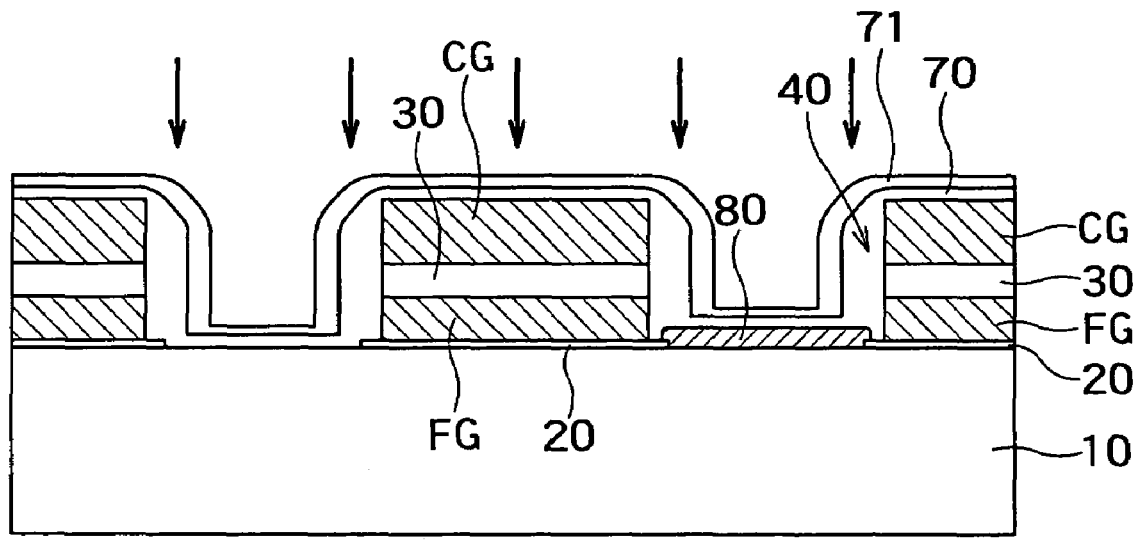

Next, as shown in FIG. 6, insulation films 70 and 71 are deposited. A material of the insulation film 70 can be the same as a material of the sidewall insulation film 40, such as a TEOS film, for example. Therefore, in FIG. 6, a interface between the insulation film 70 and the sidewall insulation film 40 is not shown. A material of the insulation film 71 is a silicon nitride film, for example. The insulation films 70 and 71 protect the semiconductor substrate 10 and the control gate electrode CG at the next ion implantation process.

Figure 7:
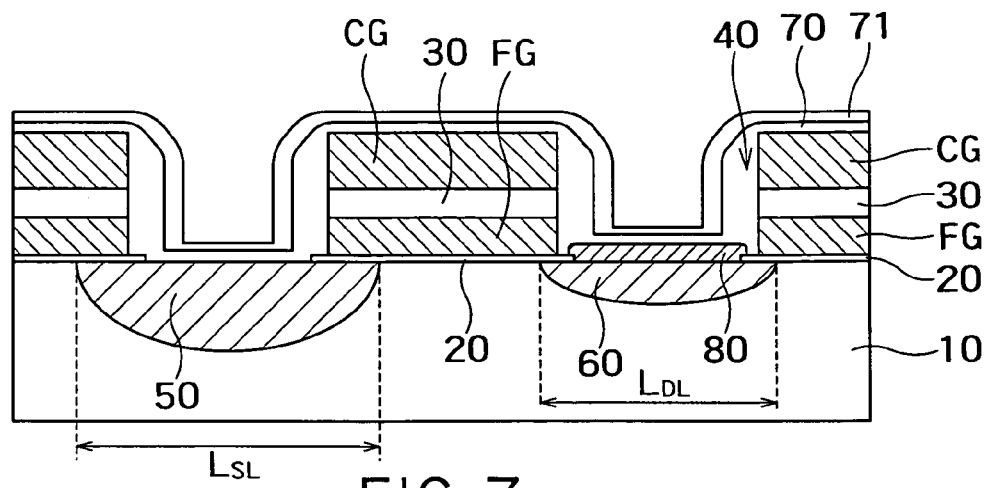

Next, impurity is ion implanted into between adjacent laminated bodies. Further, the semiconductor substrate 10 is heat treated to form the source layer 50 and the drain layer 60 as shown in FIG. 7. In carrying out the ion implantation, impurity is simultaneously introduced into the regions of the source layer 50 and the drain layer 60. However, the buffer film 80 is not present in the formation region of the source layer 50, but is present in the formation region of the drain layer 60. The buffer film 80 suppresses the introduction of the impurity into the drain region to some extent. Therefore, the amount of the impurity introduced into the formation region of the drain layer 60 is smaller than that of the impurity introduced into the formation region of the source layer 50. Consequently, the width LDL of the drain layer becomes smaller than the width LSL of the source layer, as shown in FIG. 7 and FIG. 1. As a result, viewed from above the surface of the semiconductor substrate 10, the overlapped region between the floating gate electrode FG and the drain layer 60 is smaller than the overlapped region between the floating gate electrode FG and the source layer 50.

Figure 8:
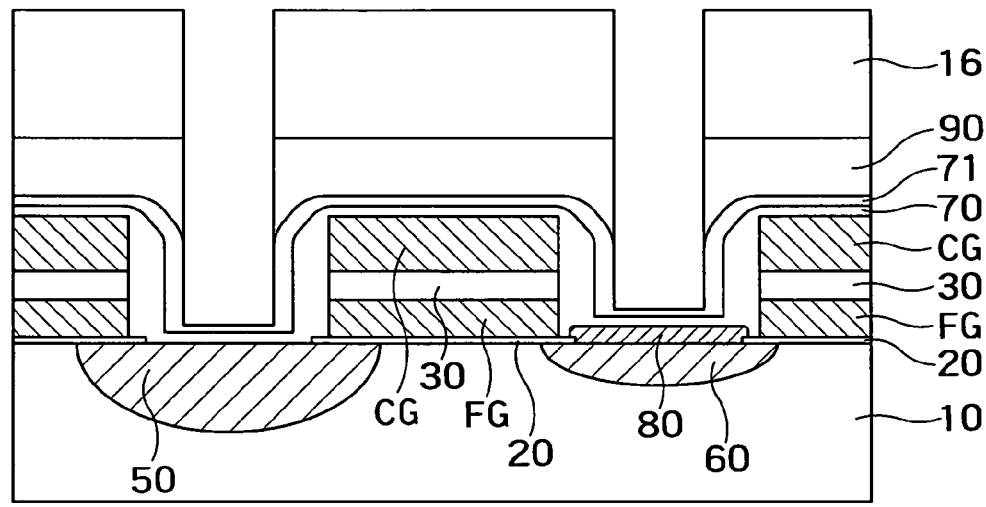
Figure 9:
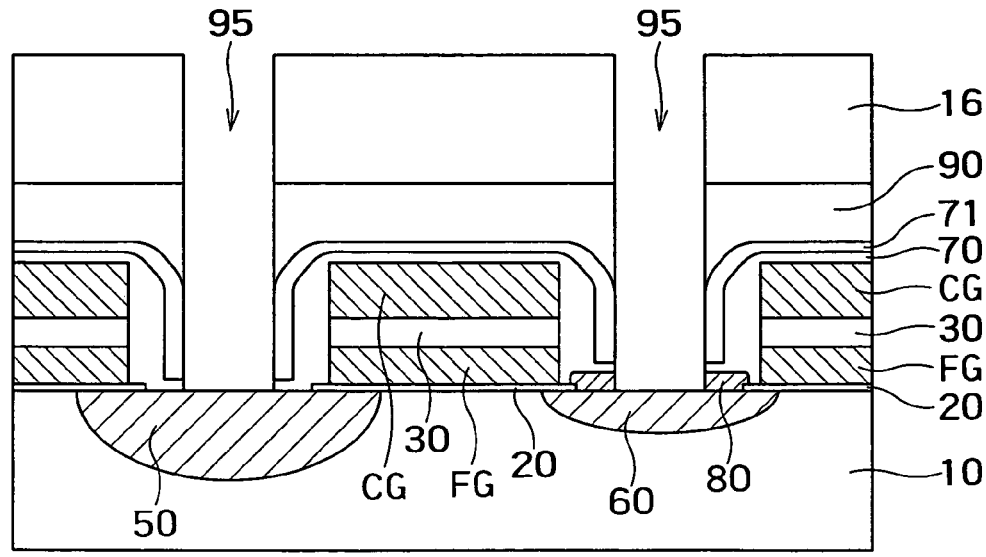

Next, an interlayer insulation film 90 is deposited on the insulation film 71, as shown in FIG. 8. A material of the interlayer insulation film 90 is a silicon oxide film, for example. A photoresist 16 is patterned using lithography, and the interlayer insulation film 90 is etched by RIE. As shown in FIG. 9, the insulation films 70 and 71 and the buffer film 80 are etched by using the sidewalls of the interlayer insulation film 90 and the insulation film 71 as a hard mask. As a result, contact holes 95 are formed on the source layer 50 and the drain layer 60, respectively.

The photoresist 16 is removed, and materials of the source electrode S and the drain electrode D are filled into the contact holes 95. As a result, the structure of the semiconductor memory device 100 as shown in FIG. 1 can be obtained.

Figure 10:
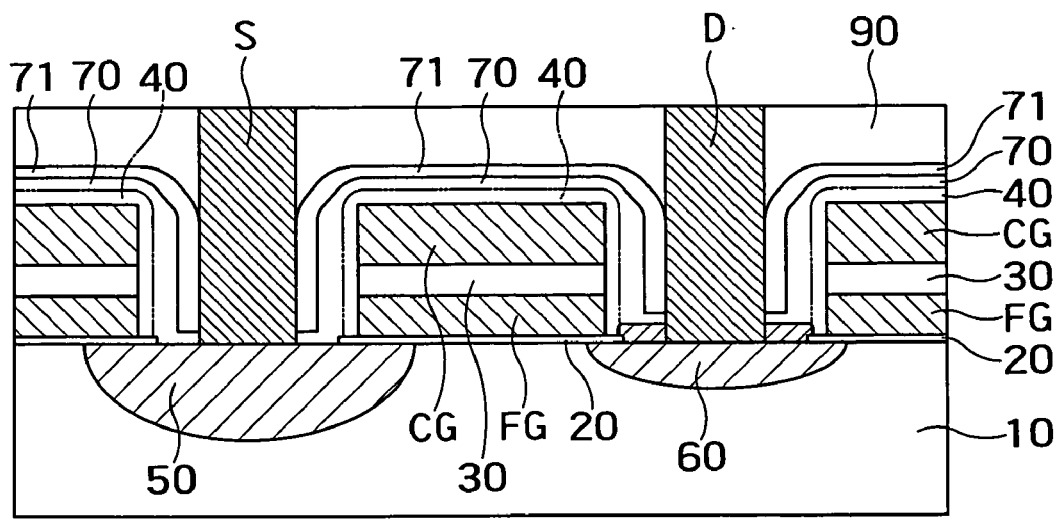
FIG. 10 is a cross-sectional diagram of the semiconductor memory device 100 having the insulation film 40 left on the control gate electrode CG.

FIG. 10 is a cross-sectional diagram of the semiconductor memory device 100 having the insulation film 40 left on the control gate electrode CG. When the insulation film 40 is left on the control gate electrode CG as shown by the broken line in FIG. 2, the insulation film on the control gate electrode CG is formed thicker by the thickness of the insulation film 40 as shown in FIG. 10.

Second Embodiment

Figure 11:
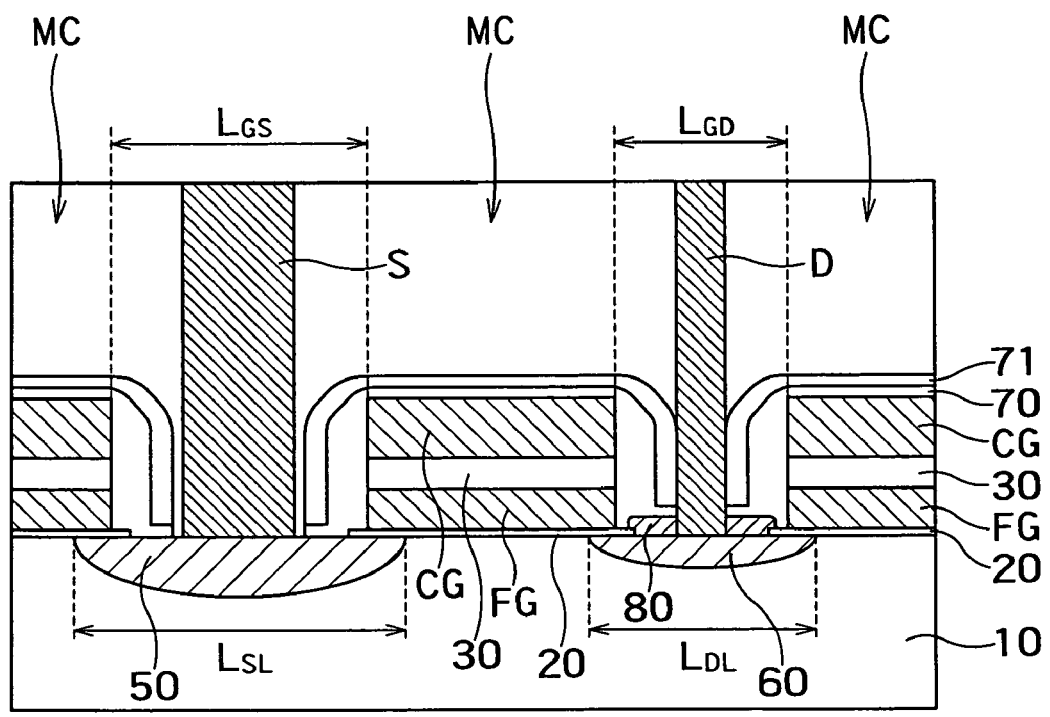
FIG. 11 is a cross-sectional diagram of a semiconductor memory device 200 according to a second embodiment of the present invention.
Figure 12:
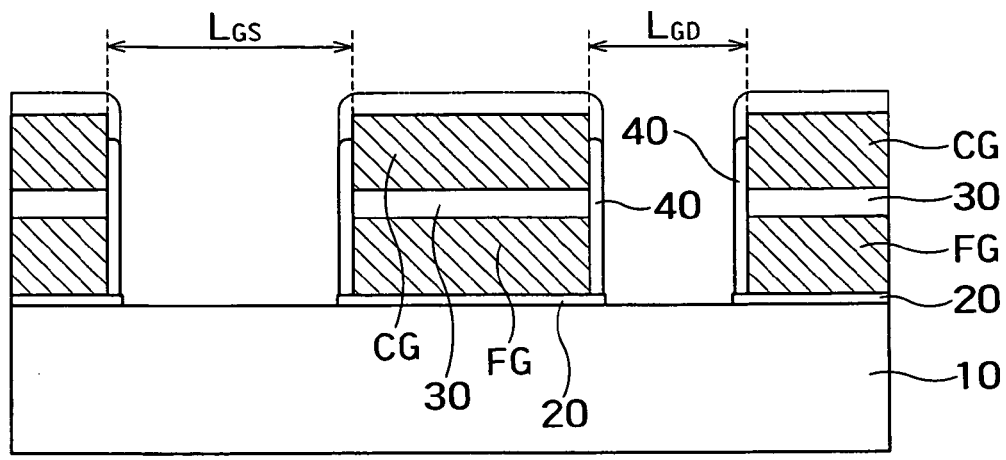
FIG. 12 to FIG. 21 are cross-sectional diagrams of the semiconductor memory device 200 showing a flow of a method of manufacturing the semiconductor memory device 200 according to the second embodiment.

FIG. 11 is a cross-sectional diagram of a semiconductor memory device 200 according to a second embodiment of the present invention. In the second embodiment, an interval LGD between memory cells adjacent at the drain electrode D side in a channel length direction is smaller than an interval LGS between memory cells adjacent at the source electrode S side in a channel length direction. In other words, LGD<LGS. Accordingly, in the cross-section of the memory cells MCs in the channel length direction, the width of the drain electrode D is smaller than the width of the source electrode S. Since LGD<LGS, the buffer film 81 (see FIG. 15 and FIG. 16) on the source layer 50 can be removed in self alignment while keeping the buffer film 80 left on the drain layer 60 in the manufacturing process of the semiconductor memory device 200. Consequently, the semiconductor memory device 200 can be manufactured in a relatively short process at low manufacturing cost.

Other configurations of the semiconductor memory device 200 according to the second embodiment can be similar to those according to the first embodiment. Therefore, viewed from above the surface of the semiconductor substrate 10, the overlapped region between the floating gate electrode FG and the drain layer 60 is smaller than the overlapped region between the floating gate electrode FG and the source layer 50. The buffer film 80 is provided on the drain layer 60. The buffer film 80 consists of an insulation film such as a silicon oxide film. However, as in the first embodiment, it is preferable that the buffer film 80 consists of a high dielectric insulation film having a higher dielectric constant than that of the silicon oxide film. This is explained in further detail in a third embodiment.

FIG. 12 to FIG. 21 are cross-sectional diagrams of the semiconductor memory device 200 showing a flow of a method of manufacturing the semiconductor memory device 200 according to the second embodiment. The method of manufacturing the semiconductor memory device 200 is explained below with reference to FIG. 12 to FIG. 21.

First, the "laminated body" including of the first gate insulation film 20, the floating gate electrode FG, the second gate insulation film 30, and the control gate electrode CG is formed in a similar manner to that according to the first embodiment. The interval LGD between laminated bodies adjacent at the drain electrode D side in a channel length direction is smaller than the interval LGS between laminated bodies adjacent at the source electrode S side in a channel length direction. In other words, the width LGD of the region in which the drain layer 60 is formed is smaller than the width LGS of the region in which the source layer 50 is formed in a channel length direction of the memory cell MC. This structure can be easily formed by changing the pattern of a photomask at the time of forming the laminated body.

Next, the material of the sidewall insulation film 40 is deposited to cover the laminated body. This insulation film is anisotropically etched by RIE, thereby forming the sidewall insulation film 40 to cover the sidewalls of the first gate insulation film 20, the floating gate electrode FG, the second gate insulation film 30, and the control gate electrode CG, respectively. At this time, the insulation film between adjacent laminated bodies is removed, and the surface of the semiconductor substrate 10 at this part is exposed. The insulation film on the control gate electrode CG is also removed. However, in order to protect the control gate electrode CG, the insulation film 40 can be left on the control gate electrode CG as shown by a broken line in FIG. 12.

Figure 13:
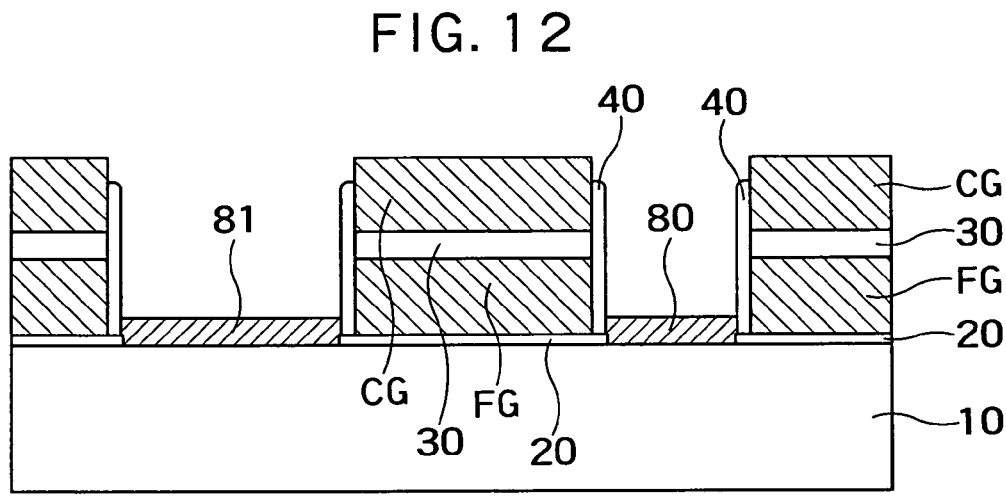
Figure 14:
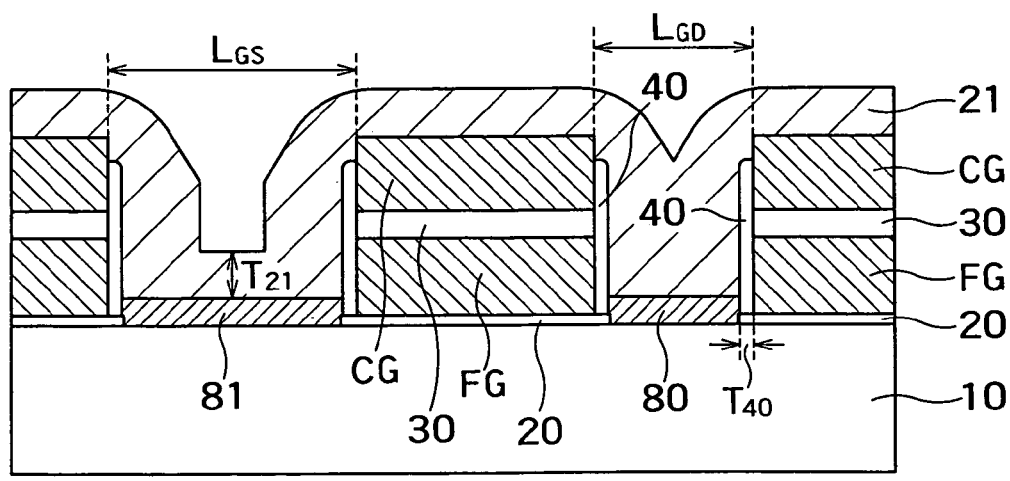

Next, the insulation film is deposited, and thereafter this insulation film is etched to form the buffer films 80 and 81 as shown in FIG. 13. The buffer film 80 is provided in the region where the drain layer 60 is formed at a later process. The buffer film 81 is provided in the region where the source layer 50 is formed at a later process. Since the buffer film 81 is removed at a later process, this film is not actually used as a buffer film. A material of the buffer films 80 and 81 can be the same as that used in the first embodiment.

Next, a masking insulation film 21 is deposited to cover the buffer films 80 and 81 and the laminated body. A material of the insulation film 21 has an etching selectivity different from that of the material of the buffer films 80 and 81. For example, the material of the insulation film 21 is a TEOS film or a silicon nitride film. In this case, the insulation film 21 is not filled between the laminated bodies in the source region, but is deposited to fill between the laminated bodies in the drain region. More specifically, when a film thickness of the insulation film 21 is expressed as T21, the film thickness T21 satisfies the following expression 1.

$$L_{GD}/2 < T_{21} < L_{GS}/2 \quad \text{(Expression 1)}$$

When a film thickness of the sidewall insulation film 40 is expressed as T40, the film thickness T21 satisfies the following expression 2.

$$((L_{GD}/2) - T_{40}) < T_{21} < ((L_{GS}/2) - T_{40}) \quad \text{(Expression 2)}$$

As a result, the insulation film 21 is not filled into between the laminated bodies in the source region, but can be filled into between the laminated bodies in the drain region. The film thickness of the insulation film 21 can be easily changed by changing a deposition time of the insulation film 21 or a gas flow rate during the deposition.

Figure 15:
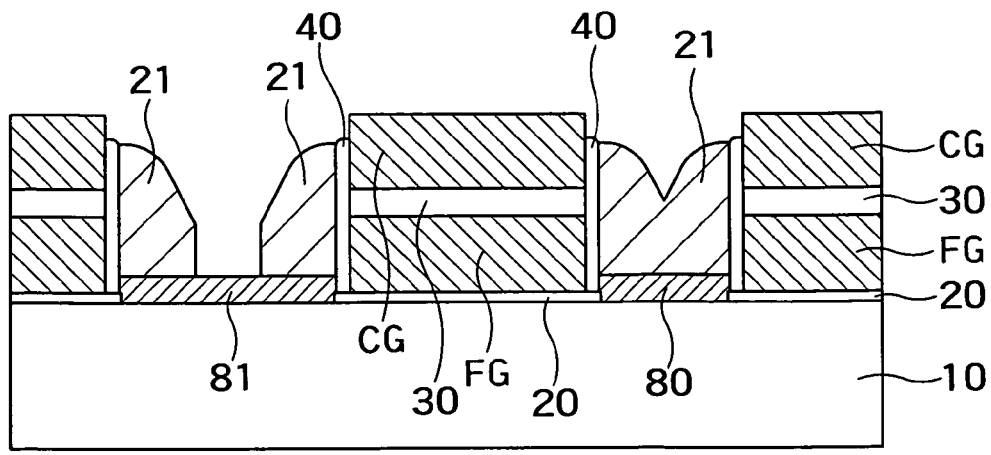

Next, the insulation film 21 is anisotropically etched using RIE. As a result, a part of the buffer film 81 in the source formation region is exposed as shown in FIG. 15. On the other hand, the whole surface of the buffer film 80 in the drain formation region is kept covered with the insulation film 21.

Figure 16:
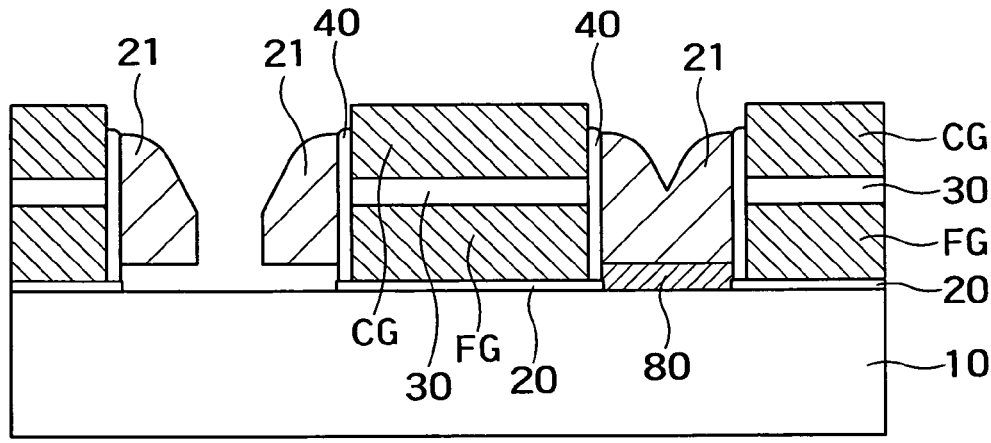
Figure 17:
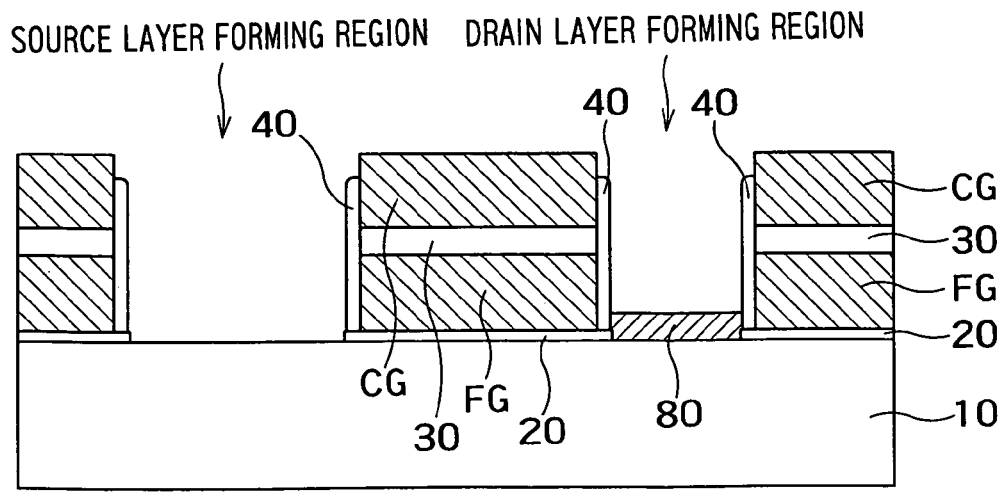

Next, as shown in FIG. 16, the buffer film 81 is removed by wet etching, using the insulation film 21 as a hard mask. Further, the insulation film 21 is removed to obtain a structure as shown in FIG. 17.

As explained above, in the second embodiment, the buffer film 81 can be exposed while keeping the buffer film 80 covered with the insulation film 21 without using a lithography process. Accordingly, the buffer film 81 can be removed in self alignment while keeping the buffer film 80 left by using the insulation film 21 as a mask.

Figure 18:
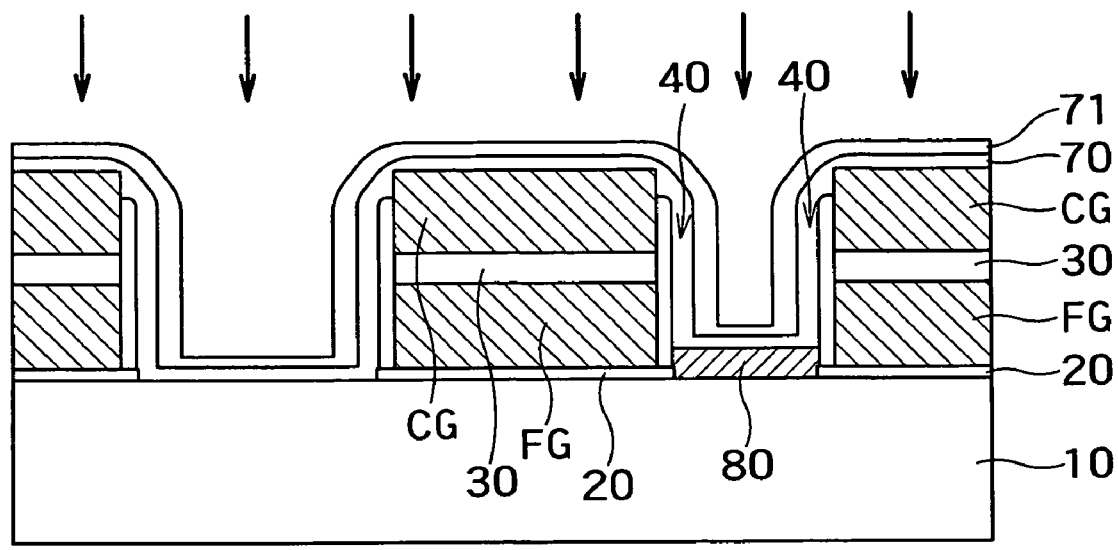
Figure 19:
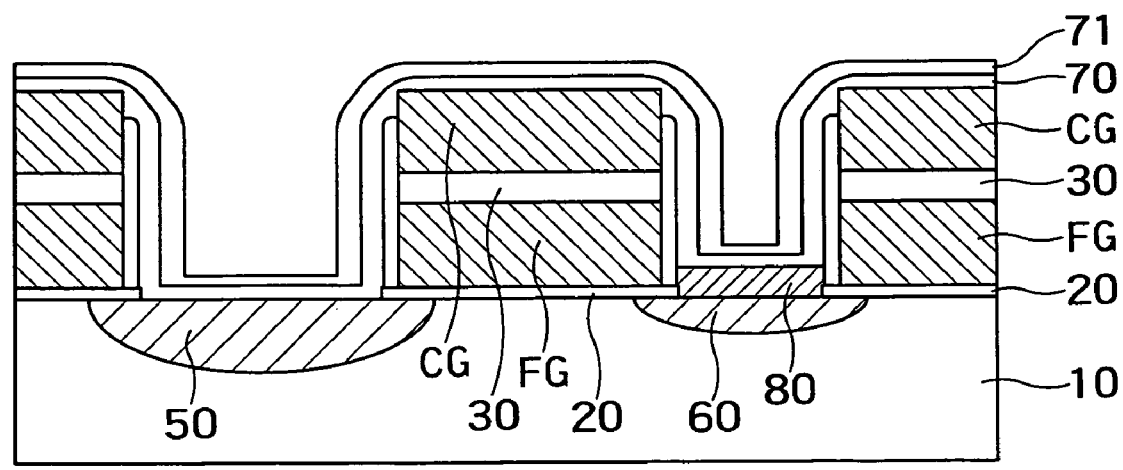

Next, the insulation films 70 and 71 are deposited as shown in FIG. 18. Materials of the insulation films 70 and 71 can be the same as those according to the first embodiment. Next, impurity is ion implanted into between adjacent laminated bodies. The semiconductor substrate 10 is heat treated to form the source layer 50 and the drain layer 60 as shown in FIG. 19. In carrying out the ion implantation, impurity is simultaneously introduced into the regions of the source layer 50 and the drain layer 60. However, the buffer film 80 is not present in the formation region of the source layer 50, but is present in the formation region of the drain layer 60. The buffer film 80 suppresses the introduction of the impurity into the drain region to some extent. Therefore, the amount of the impurity introduced into the formation region of the drain layer 60 is smaller than that of the impurity introduced into the formation region of the source layer 50. Consequently, the width LDL of the drain layer becomes smaller than the width LSL of the source layer as shown in FIG. 19 and FIG. 11. As a result, viewed from above the surface of the semiconductor substrate 10, the overlapped region between the floating gate electrode FG and the drain layer 60 is smaller than the overlapped region between the floating gate electrode FG and the source layer 50.

Figure 20:
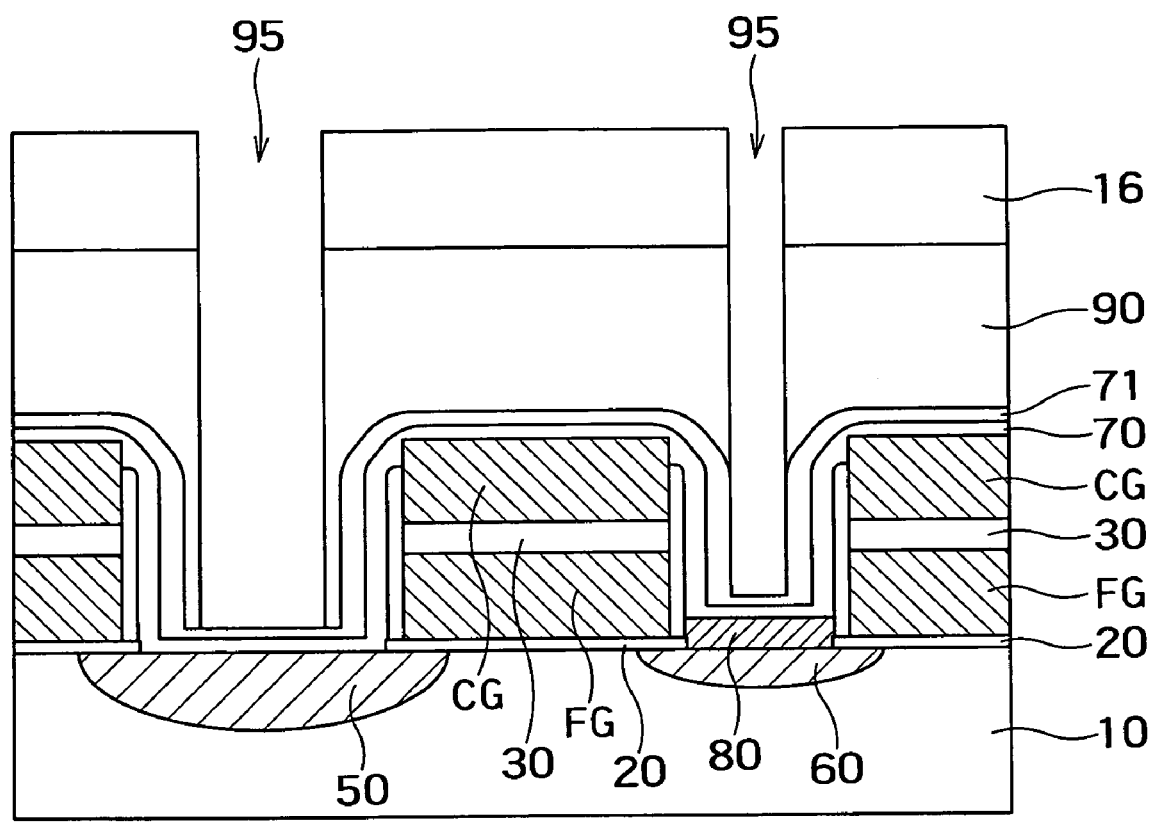
Figure 21:
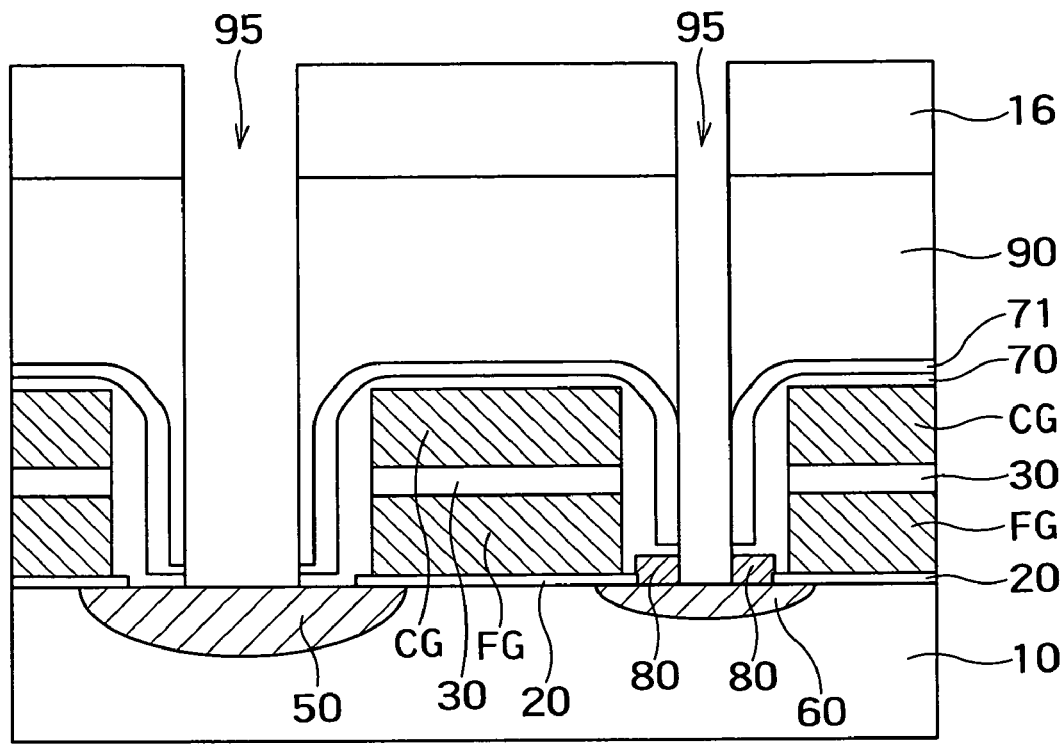

Next, the interlayer insulation film 90 is deposited on the insulation film 71, as shown in FIG. 20. The material of the interlayer insulation film 90 is a silicon oxide film, for example. The photoresist 16 is coated on the interlayer insulation film 90 and is then patterned using lithography. Thereafter, the interlayer insulation film 90 is etched by RIE. As shown in FIG. 21, the insulation films 70 and 71 and the buffer film 80 are etched using the interlayer insulation film 90 as a hard mask. As a result, the contact holes 95 are formed on the source layer 50 and the drain layer 60, respectively.

The photoresist 16 is removed, and the materials of the source electrode S and the drain electrode D are filled into the contact holes 95. As a result, the structure of the semiconductor memory device 200 as shown in FIG. 11 can be obtained.

Figure 22:
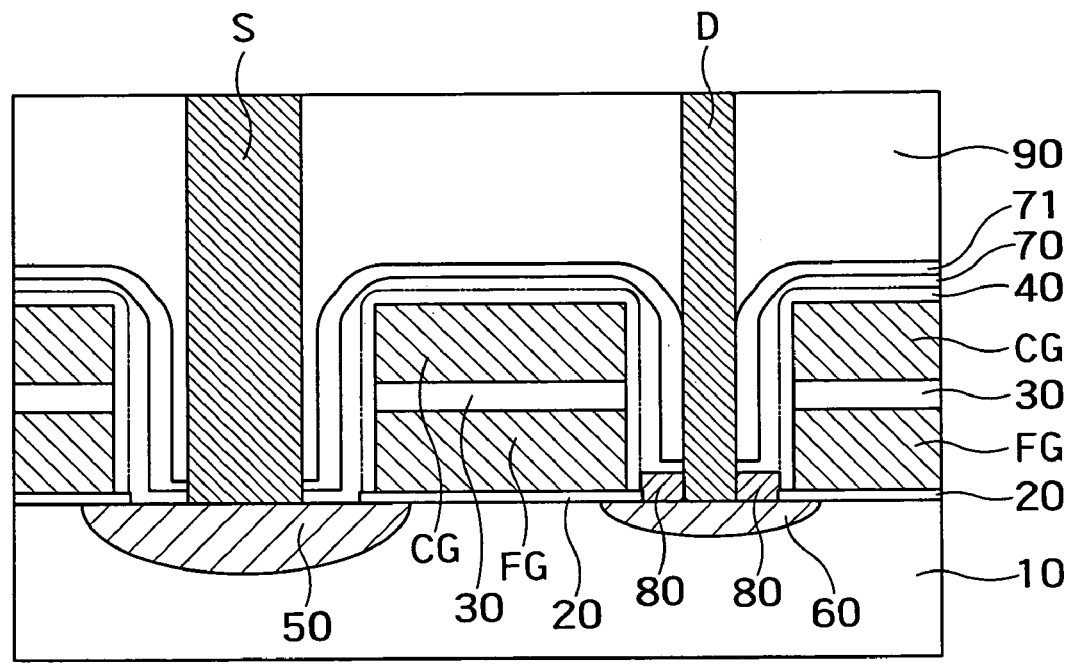
FIG. 22 is a cross-sectional diagram of the semiconductor memory device 200 having the insulation film 40 left on the control gate electrode CG.

FIG. 22 is a cross-sectional diagram of the semiconductor memory device 200 having the insulation film 40 left on the control gate electrode CG. When the insulation film 40 is left on the control gate electrode CG as shown by the broken line in FIG. 22, the insulation film on the control gate electrode CG is formed thick corresponding to the thickness of the insulation film 40 as shown in FIG. 22.

In the first and the second embodiments, the ion implantation process to form the source layer 50 and the drain layer 60 is carried out after depositing the insulation films 70 and 71. However, this ion implantation process can be also carried out before depositing the insulation film 71 after depositing the insulation film 70 (see FIG. 18). Alternatively, the ion implantation process can be carried out as follows. In the process of forming the contact hole 95, when the surface of the insulation film 71 in the source and the drain regions is exposed, the etching is stopped, and the ion implantation is carried out. Thereafter, the insulation films 71 and 70 and the buffer film 80 are etched (see FIG. 20).

According to the second embodiment, a semiconductor memory device exerting the same effect as that in the first embodiment can be formed in self alignment without additionally carrying out a photomasking and photolithographic process. Therefore, according to the second embodiment, the semiconductor memory device can be manufactured in a relatively short manufacturing process at low cost.

Third Embodiment

According to the third embodiment, the buffer film 80 consists of a high dielectric insulation film having a higher dielectric constant than that of a silicon oxide film. Other configurations of the semiconductor memory device according to the third embodiment can be the same as those according to the first embodiment or the second embodiment.

Figure 23:
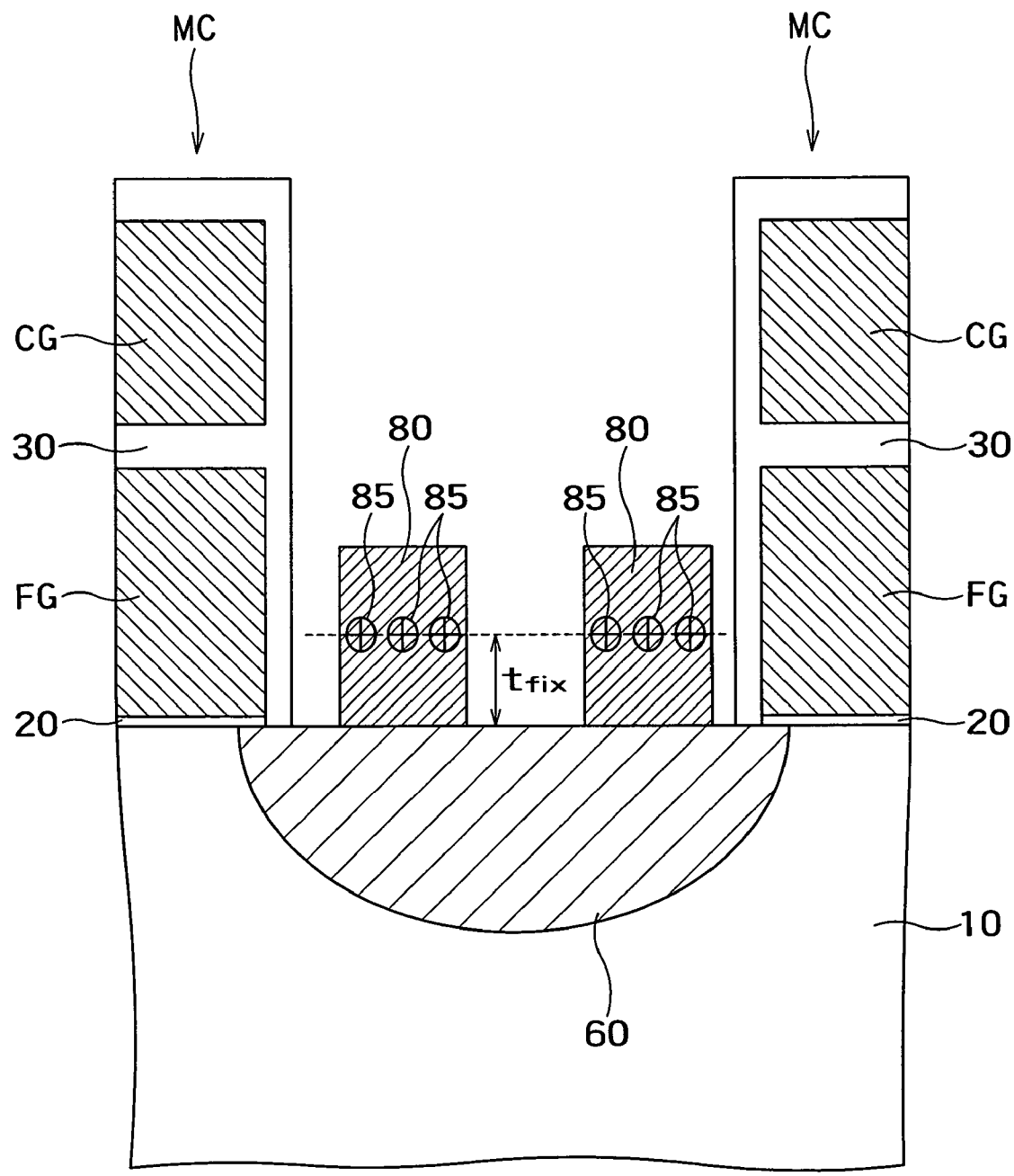
FIG. 23 is a schematic diagram showing a configuration of the drain layer 60 and its periphery according to the third embodiment.

FIG. 23 is a schematic diagram showing a configuration of the drain layer 60 and its periphery according to the third embodiment. It is known that when the buffer film 80 consists of a high dielectric insulation film, positive stationary electric charges are generated within the buffer film 80 during the manufacturing of the semiconductor memory device. Since the buffer film 80 is present on the drain layer 60, a positive voltage corresponding to the amount of stationary electric charges included in the buffer film 80 is always applied to the drain layer 60. The drain voltage can be decreased corresponding to the positive voltage.

Assume, for example, that the buffer film 80 is made of alumina (Al2O3) of a specific dielectric constant "15" and that positive stationary electric charges of surface density $2.2 \times 10^{12}$ cm-3 are present at the height Tfix=1 nm from the surface of the semiconductor substrate 10 within the buffer film 80. An electric potential of the buffer film 80 of its own (hereinafter also referred to as a self electric potential) is assumed to be about 0.5 V. In other words, a positive electric potential of about 0.5 V is always working in the drain layer 60. As a result, the drain voltage can be decreased by about 0.5 V without deteriorating the characteristics of the semiconductor memory device 100 or 200. Alternatively, a voltage actually applied to the drain layer 60 can be increased by about 0.5 V while maintaining a voltage applied to the drain electrode D.

For the buffer film 80, a material having a dielectric constant above the dielectric constant of a thermally-oxidized film can be used. For example, any one of high dielectric constant films made of Al2O3, TiO2, TaO2, HfO2, HfSiON, HfON, SiN, SiON, and the like can be used.

Figure 24:
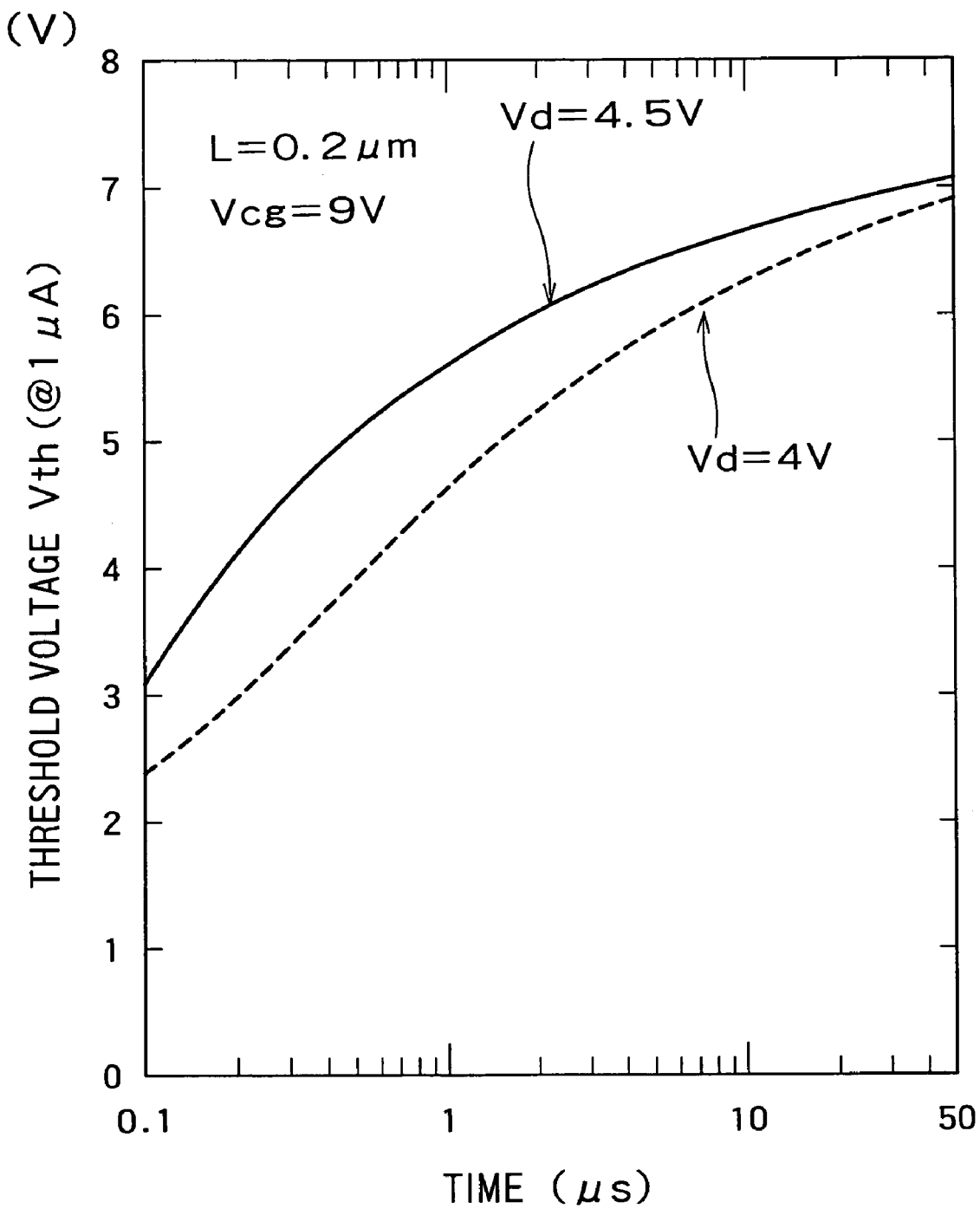
FIG. 24 is a graph showing data writing characteristics of data that is written into an NOR nonvolatile semiconductor memory device.

FIG. 24 is a graph showing data-writing characteristics of an NOR nonvolatile semiconductor memory device. An influence imparted on the data-writing characteristics when the drain voltage is increased by 0.5 V is explained with reference to this graph. The horizontal axis of this graph represents time (writing time) during which a voltage is applied to the control gate electrode CG. The vertical axis of this graph represents a threshold voltage Vth that changes according to the electric charges stored in the floating gate electrode FG. A broken line represents a threshold voltage Vth when a drain voltage Vd is 4 V. A solid line represents a threshold voltage Vth when the drain voltage Vd is 4.5 V. The threshold voltage Vth is a gate voltage when a drain current Id is 1 μA. A gate length L of the memory cell MC is 0.2 μm, and a control gate voltage Vcg is 9 V.

In order to write data so that the threshold voltage Vth becomes 4 V, it takes about 0.7 μs when the drain voltage Vd=4 V. When the drain voltage Vd=4.5 V, it takes only about 0.2 μs. In other words, when the drain voltage is increased by about 0.5 V, the time required to write data into the memory cell MC can be shortened.

Usually, the data writing time is 1 μs to a few μs. Therefore, the writing time is assumed as 1 μs. In this case, when the drain voltage Vd=4 V, the threshold voltage is about 4.3 V. On the other hand, when Vd=4.5 V, the threshold voltage is about 5.3 V. In other words, even when the writing time is the same, the threshold voltage can be increased by increasing the drain voltage by about 0.5 V. This means that the data writing efficiency is improved.

As explained above, according to the third embodiment, the power supply voltage can be decreased by the self electric potential of positive stationary electric charges 85 that are present within the buffer film 80 on the drain layer 60, without lowering the speed of data writing operation.

Figure 25:
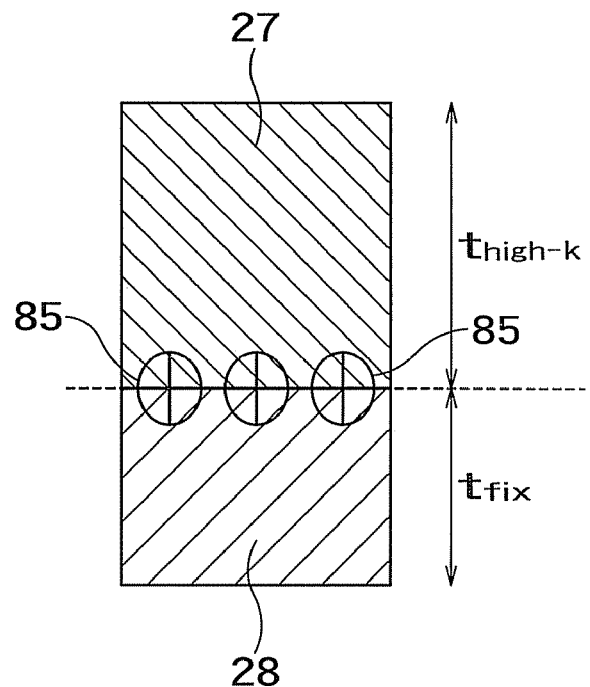
FIG. 25 shows a configuration described in: S. Saito et al., "Extended Abstracts of the 2002 International Conference on Solid State Devices and Materials", pp. 704-705, 2002.

FIG. 25 shows a configuration described in: S. Saito et al., "Extended Abstracts of the 2002 International Conference on Solid State Devices and Materials", pp. 704-705, 2002. An alumina (Al2O3) film (thigh-k=2 nm) 27 is provided on a silicon oxide film 28 (tfix=2 nm). The positive stationary electric charges 85 in a surface density of 1×1013 cm-3 are present at the interface between the silicon oxide film 28 and the alumina film 27. According to the structure described in the known literature, the self electric potential of the stationary electric charges 85 is about 0.9 V, which is a sufficiently large value.

As described above, positive stationary electric charges of surface density 2.2×1012 cm-3 can be formed in a high dielectric substance. In other words, the above known literature shows that the semiconductor memory device according to the third embodiment can be provided.

Figure 26:
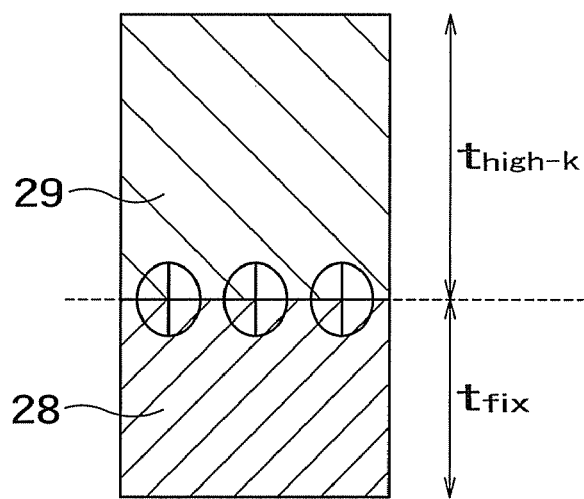
FIG. 26 shows a configuration described in: A. Kaneko et al., "Extended Abstracts of the 2003 International Conference on Solid State Devices and Materials", pp. 56-57, 2003.

FIG. 26 shows a configuration described in: A. Kaneko et al., "Extended Abstracts of the 2003 International Conference on Solid State Devices and Materials", pp. 56-57, 2003. A HfSiO film 29 is deposited on the silicon oxide film 28. This known literature shows that the stationary electric charge amount or stationary electric charge density can be controlled by changing a manufacturing condition, for example, an annealing temperature or time.

Therefore, the amount or density of the positive stationary electric charges 85 included in the buffer film 80 can be optionally controlled by suitably setting a manufacturing condition.

Thus, the buffer film 80 including an optional amount of stationary electric charges or optional density of stationary electric charges can be formed by performing a realistic manufacturing process without deteriorating data writing characteristics.

Furthermore, when the third embodiment is combined with the first embodiment, effects similar to those of the first embodiment can be obtained. When the third embodiment is combined with the second embodiment, effects similar to those of the second embodiment can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A semiconductor memory device comprising:
   a memory cell which includes
   a semiconductor substrate;
   a first gate insulation film provided on the semiconductor substrate;
   a floating gate electrode provided on the first gate insulation film;
   a second gate insulation film provided on the floating gate electrode;
   a control gate electrode provided on the second gate insulation film;
   a source layer and a drain layer respectively provided either side of a channel region which is below the floating gate electrode;
   a source electrode that is electrically connected to and provided on the source layer;
   a buffer film including positive stationary electric charges, the buffer film being provided on the drain layer, but being not provided on the source layer; and
   a drain electrode electrically connected to and provided on the drain layer through the buffer film.

2. The semiconductor memory device according to claim 1, wherein
   the buffer film consists of a high dielectric insulation film having a higher dielectric constant than that of a silicon oxide film.

3. The semiconductor memory device according to claim 1, wherein
   the memory cell further comprises a sidewall insulation film that covers sidewalls of the floating gate electrode and the control gate electrode, respectively, and
   the buffer film is made of an insulation material having an etching rate different from an insulation material of the sidewall insulation film.

4. The semiconductor memory device according to claim 1, wherein
   the semiconductor memory device is a NOR flash memory.

5. The semiconductor memory device according to claim 1, wherein a plurality of the memory cells are arranged adjacently each other in channel length direction,
   wherein an interval between memory cells adjacent at the drain electrode side is smaller than an interval between memory cells adjacent at the source electrode side.

6. The semiconductor memory device according to claim 5, wherein when viewing the surface of the semiconductor substrate from above, an overlapped area between the floating gate electrode and the drain layer is smaller than an overlapped area between the floating gate electrode and the source layer.

7. The semiconductor memory device according to claim 5, wherein
   in the cross-section of the memory cells in the channel length direction, the width of the drain electrode is smaller than the width of the source electrode.

* * * * *